United States Patent
Garbossa et al.

(10) Patent No.: US 11,165,417 B2
(45) Date of Patent: Nov. 2, 2021

(54) EFFICIENT HIGH-VOLTAGE DIGITAL I/O PROTECTION

(71) Applicant: Infineon Technologies AG, Neubiberg (DE)

(72) Inventors: Cristian Garbossa, Bressanone (IT); Luca Lentola, Battaglia Terme (IT); Devis Fiorin, Candiana (IT)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 16/576,649

(22) Filed: Sep. 19, 2019

(65) Prior Publication Data
US 2021/0091762 A1 Mar. 25, 2021

(51) Int. Cl.
*H02H 3/20* (2006.01)
*H03K 17/0812* (2006.01)
*H02H 1/00* (2006.01)

(52) U.S. Cl.
CPC ......... *H03K 17/08122* (2013.01); *H02H 3/20* (2013.01)

(58) Field of Classification Search
CPC ... H03K 17/08122; H02H 3/20; H02H 1/0007
See application file for complete search history.

(56) References Cited

U.S. PATENT DOCUMENTS

| 5,951,660 A * | 9/1999 | Van Wonterghem .. | H02H 9/004 361/58 |
|---|---|---|---|
| 6,362,653 B1 | 3/2002 | Coughlin, Jr. et al. | |
| 6,703,889 B2 * | 3/2004 | Dodson, III | H02H 9/025 327/328 |
| 7,696,646 B2 * | 4/2010 | Tu | H03K 17/162 307/113 |
| 9,221,251 B2 * | 12/2015 | Van Brocklin | B41J 2/0452 |
| 9,837,158 B2 * | 12/2017 | Song | G11C 16/26 |
| 2002/0067185 A1 | 6/2002 | Kunz et al. | |
| 2006/0049859 A1 * | 3/2006 | Hwang | H03K 17/063 327/108 |

(Continued)

FOREIGN PATENT DOCUMENTS

| EP | 2815506 A1 | 12/2014 |
|---|---|---|
| WO | 03103145 A1 | 12/2003 |
| WO | 2016044474 A1 | 3/2016 |

*Primary Examiner* — Sisay G Tiku
(74) *Attorney, Agent, or Firm* — Shumaker & Sieffert, P.A.

(57) ABSTRACT

A circuit to protect a digital input and output (I/O) terminal from an overvoltage applied externally to the digital I/O terminal. The circuit is arranged similar to a bootstrap switch such that a pass-device protects an output driver from an overvoltage applied to the digital I/O terminal and the output driver controls the operation of the pass-device, such as an N-channel metal-oxide semiconductor (NMOS) transistor. The circuit may include a capacitor and a diode coupled to the gate of the NMOS transistor. A digital zero from the output driver charges the capacitor. A digital one from the output driver causes the charged capacitor, coupled between source and the gate of the NMOS transistor, provides sufficient gate-source voltage to pass the digital one from the driver to the digital I/O terminal. The circuit further includes refresh circuitry configured to maintains the gate source voltage on the capacitor.

20 Claims, 7 Drawing Sheets

(56) References Cited

U.S. PATENT DOCUMENTS

| | | | |
|---|---|---|---|
| 2006/0158232 A1* | 7/2006 | Lenz | H03K 19/01721 |
| | | | 327/112 |
| 2008/0007317 A1* | 1/2008 | Bodano | H03K 17/063 |
| | | | 327/390 |
| 2009/0121912 A1* | 5/2009 | Zanchi | H03K 19/00384 |
| | | | 341/172 |
| 2012/0229175 A1* | 9/2012 | Serventi | H03K 19/00315 |
| | | | 327/109 |
| 2015/0210071 A1 | 7/2015 | Van Brocklin | |
| 2016/0079785 A1* | 3/2016 | Kinzer | H01L 29/2003 |
| | | | 320/107 |
| 2017/0093388 A1 | 3/2017 | Yang et al. | |
| 2017/0115718 A1 | 4/2017 | Shankar et al. | |
| 2018/0062376 A1* | 3/2018 | La Rosa | H02H 9/041 |
| 2018/0254644 A1* | 9/2018 | Cho | H02J 7/0029 |
| 2020/0295745 A1* | 9/2020 | Niikura | H03K 17/0822 |

\* cited by examiner

EFFICIENT HIGH-VOLTAGE DIGITAL I/O PROTECTION

TECHNICAL FIELD

The disclosure relates to overvoltage protection of digital circuits.

BACKGROUND

Digital circuits may operate in an environment where a digital output terminal can be subjected to a voltage high enough to damage the digital circuit, for example, a high voltage caused by a fault or transient voltage in the system that may be applied to the digital output terminal. To protect the digital circuitry, a digital circuit may drive the digital output terminal with an output driver that may be resistant to damage from an overvoltage at the digital output terminal. Output drivers that are resistant to overvoltage damage may have a disadvantage in that the driver may occupy a relatively large area on an integrated circuit (IC) and may have slower operating speeds when compared to lower voltage output drivers that are less resistant to overvoltage. In other examples, an overvoltage resistant pass device, such as a transistor, may protect a lower voltage output driver from an overvoltage at the digital output terminal.

SUMMARY

In general, the disclosure is directed to circuits configured to protect a digital input and output (I/O) terminal from an overvoltage applied externally to the digital I/O terminal. The circuits may be arranged to include circuitry similar to a bootstrap switch such that a pass-device protects the output driver from a possible overvoltage applied to the digital I/O terminal and the output driver controls the operation of the pass-device. In one example, the pass-device is an N-channel metal-oxide semiconductor (NMOS) transistor. The circuit may include a capacitor and a diode coupled to the gate of the NMOS transistor. A digital zero from the output driver to the output terminal, may charge the capacitor. When the output driver sends a digital one to the output terminal, the charged capacitor, coupled between source and the gate of the NMOS transistor, is configured to provide sufficient gate-source voltage to pass the digital one from the driver to the digital I/O terminal. The circuits may further include refresh circuitry, configured to maintain the gate source voltage on the capacitor.

In one example, the disclosure is directed to a circuit comprising: a driver circuit comprising an input element and an output element, wherein the output element is electrically coupled to a digital output terminal via a pass-device. The pass-device comprises a first terminal, a second terminal and a control terminal, the pass-device is configured to protect the driver circuit from an overvoltage applied to the digital output terminal, the output element of the driver circuit is electrically connected both to the first terminal of the pass-device and via a capacitor to the control terminal of the pass-device, the control terminal of the pass-device is coupled to a supply voltage through a switch, and the second terminal of the pass-device is coupled to the digital output terminal.

In another example, the disclosure is directed to a method comprising: in response to receiving a digital zero at an input element of a driver circuit, charging a capacitor such that the magnitude of voltage across the capacitor is approximately first supply voltage, wherein the capacitor is coupled to the first supply voltage through a switch, and wherein the capacitor is connected between a gate and a source of an N-channel metal-oxide semiconductor (NMOS) pass-device. In response to receiving a digital one at the input element of the driver circuit, applying, by the driver circuit, a second voltage to the source of the NMOS pass-device such that the gate-source voltage of the NMOS pass-device is approximately the magnitude of voltage across the capacitor.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to a circuit configured to protect a digital input and output (I/O) terminal from an overvoltage applied externally to the digital I/O terminal. The circuit protects the digital I/O terminal with a pass-device that protects the output driver for the digital I/O terminal from a possible overvoltage applied to the digital I/O terminal. The circuit may be arranged similar to a bootstrap switch, but unlike other examples of protection circuits, the output driver may control the operation of the pass-device rather than additional circuitry, such as a charge pump.

In some examples, the pass-device may comprise an N-channel metal-oxide semiconductor (NMOS) transistor. The circuit may include a capacitor and a diode coupled to the gate of the NMOS transistor. A digital zero from the output driver to the output terminal, charges the capacitor. When the output driver sends a digital one to the output terminal, the charged capacitor, coupled between source and the gate of the NMOS transistor, is configured to provide sufficient gate-source voltage to the NMOS transistor to pass the digital one from the driver to the digital I/O terminal.

In some examples, components in the circuit may be subject to leakage, such as when the digital I/O terminal outputs a digital one for an extended period. Some examples of leakage sources may include gate leakage for the NMOS transistor, leakage across the capacitor, and so on. To counter these or other types of leakage, the circuit may further include refresh circuitry, which maintains the gate source voltage across the capacitor to ensure the pass-device remains ON while outputting a digital one.

Figure 1:
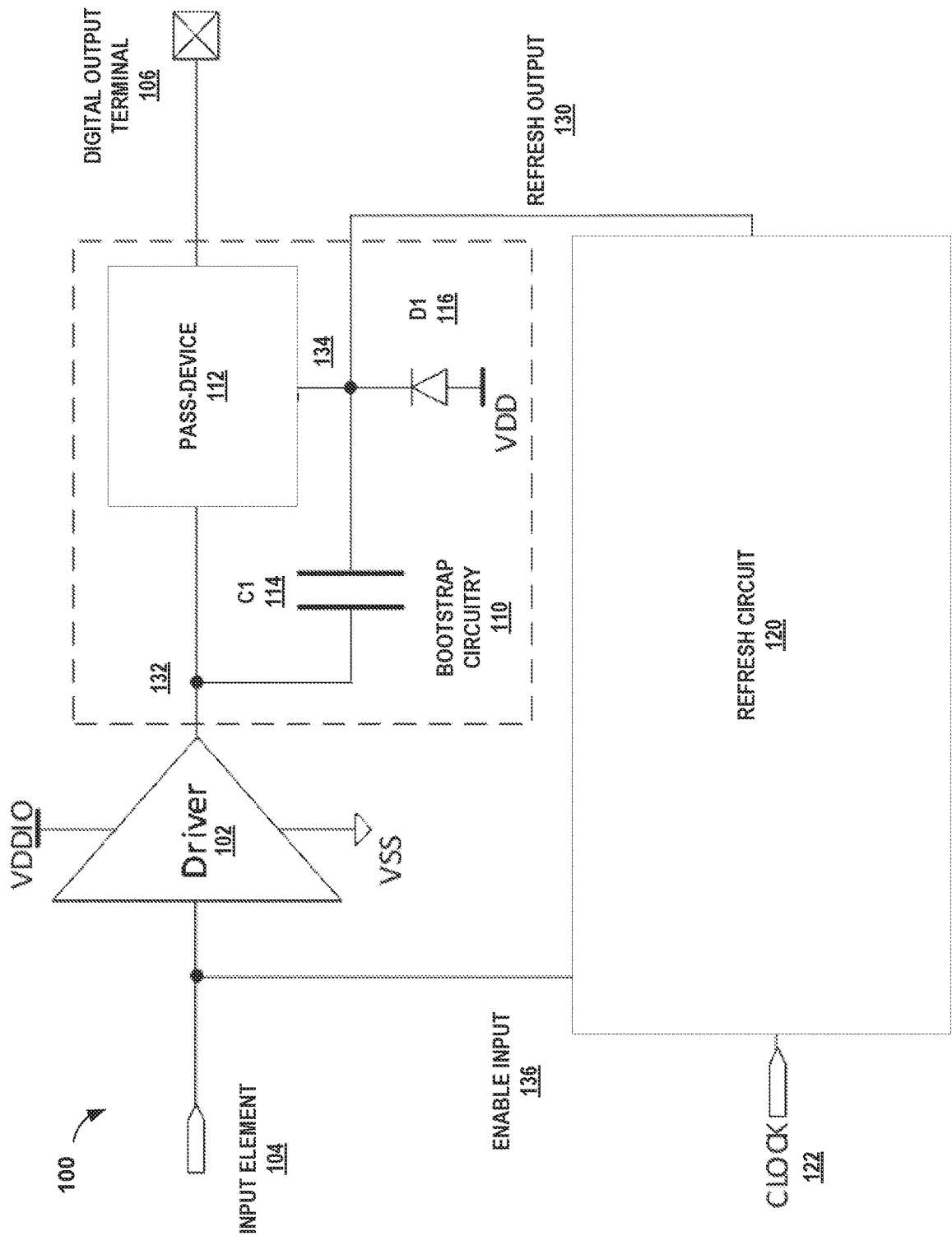
FIG. 1 is a block diagram illustrating a digital I/O terminal with output driver protection circuitry, according to one or more techniques of this disclosure.

FIG. 1 is a block diagram illustrating a digital I/O terminal with output driver protection circuitry, according to one or more techniques of this disclosure. Circuit 100 may be implemented in many different types of circuits in which a digital output terminal provides a digital output signal to one or more other components in a system.

In the example of FIG. 1, circuit 100 includes driver circuit 102, which is electrically coupled to digital output terminal 106 through pass-device 112. Bootstrap circuitry 110 includes capacitor C1 114 and diode D1 116, which connects a control terminal 134 of pass-device 112 to Vdd. Capacitor C1 114 connects output element 132 of driver circuit 102 to control terminal 134. In the example of FIG. 1, output element 132 of driver circuit 102 is electrically connected directly to an input terminal of pass-device 112.

Refresh circuit 120 receives signals from input element 104 and includes an output element, refresh output element 130, which is coupled to the control terminal 134 of pass-device 112. Refresh circuit 120 also includes clock input element 122.

Driver circuit 102 may comprise a digital output driver that receives digital signals at input element 104 and outputs a buffered digital signal at output element 132. In some examples, the digital signals to input element 104 may come from digital circuitry on the same IC as circuit 100. Driver circuit 102 may also be connected to digital supply voltage $V_{DDIO}$ and reference voltage Vss. In the example of FIG. 1, $V_{DDIO}$ is approximately 5V and reference voltage Vss is approximately zero volts. A digital zero received at input element 104 may cause driver circuit 102 to output a digital zero at output element 132, i.e. approximately zero volts. Similarly, a digital one at input element 104 may cause driver circuit 102 to output a digital one at output element 132, i.e. approximately $V_{DDIO}$.

Bootstrap circuitry 110 functions using principles similar to a bootstrap switch circuit, which is a type of circuit that may be used to drive the gate voltage on a high side switch to cause a gate voltage higher than the power supply rail. However, unlike a typical bootstrap switch circuit, in the example of circuit 100, the anode of diode D1 116 is connected to Vdd, while the cathode connects to control terminal 134 and to one terminal of capacitor C1 114.

In operation, when circuit 100 receives a digital zero at input element 104, driver circuit 102 outputs a digital zero at output element 132, causing capacitor C1 114 to charge to approximately Vdd. In other words, driver circuit 102 is configured to output reference voltage Vss to a first plate of capacitor C1 114, which causes a second plate of capacitor C1 114 coupled to the cathode of D1 116 to charge to approximately a magnitude of the supply voltage, Vdd. The voltage across C1 114 becomes Vdd, minus the voltage drop across D1 116 and minus any further voltage drop between output element 132 and reference voltage Vss. In the example of FIG. 1, Vss is zero volts. In the example of FIG. 1, Vdd is approximately half the magnitude of $V_{DDIO}$. In the example of FIG. 1, $V_{DDIO}$ is approximately 5V and Vdd is approximately 2V5. In other examples Vdd and $V_{DDIO}$ may be set to different voltage magnitudes, such as $V_{DDIO}$=3.3V. In other examples, Vdd may be set to a magnitude different from half of $V_{DDIO}$.

When circuit 100 receives a digital one at input element 104, driver circuit 102 outputs a digital one at output element 132, which in the example of FIG. 1 is approximately $V_{DDIO}$ less any voltage drop between $V_{DDIO}$ and output element 132. Capacitor C1 114 may retain the voltage between the first plate and the second plate of capacitor C1 114, and therefore the magnitude of voltage between the input terminal of pass-device 112 and control terminal 134 remains approximately Vdd, to ensure pass-device 112 allows the digital one from driver circuit 102 to be output from digital output terminal 106. In the example in which pass-device 112 is an NMOS transistor, capacitor C1 114 may provide sufficient gate-source voltage (Vgs) to keep the NMOS transistor turned ON. In the example of an insulated gate bipolar transistor (IGBT), capacitor C1 114 may provide sufficient gate voltage to ensure the IGBT remains ON. Note that the terms "first plate" and "second plate" are used to simplify the explanation of bootstrap circuitry 110 as shown in FIG. 1. An actual capacitor may be constructed using multiple layers of plates and dielectric material. Also, in this disclosure the first plate may be described as being connected to a first terminal or first element of capacitor C1 114. Similarly, the second plate may be described as being connected to a second terminal or second element of capacitor C1 114.

In some examples, diode D1 116 may operate as a switch because D1 116 may be ON when the voltage at control terminal 134 is less than Vdd. When the voltage at control terminal 134 is more than Vdd, D1 116 will prevent current from flowing from control terminal 134 to Vdd. Therefore, when the voltage at control terminal 134 is greater than Vdd, then diode D1 116 may be considered as a switch that is OFF.

Refresh output element 130 of refresh circuit 120 connects to control terminal 134. In operation, when circuit 100 receives a digital one at input element 104, enable input element 136 of activates refresh circuit 120 to apply a predetermined voltage amplitude at control terminal 134 of pass-device 112. Refresh circuit 120 is configured to periodically apply the predetermined magnitude of voltage at the gate of the pass-device based on a clock signal received at clock input element 122 to counter any leakage in bootstrap circuitry 110, such as at capacitor C1 114. The circuit arrangement of circuit 100 may provide an advantage in reduced current consumption, when compared to other techniques.

Figure 2:
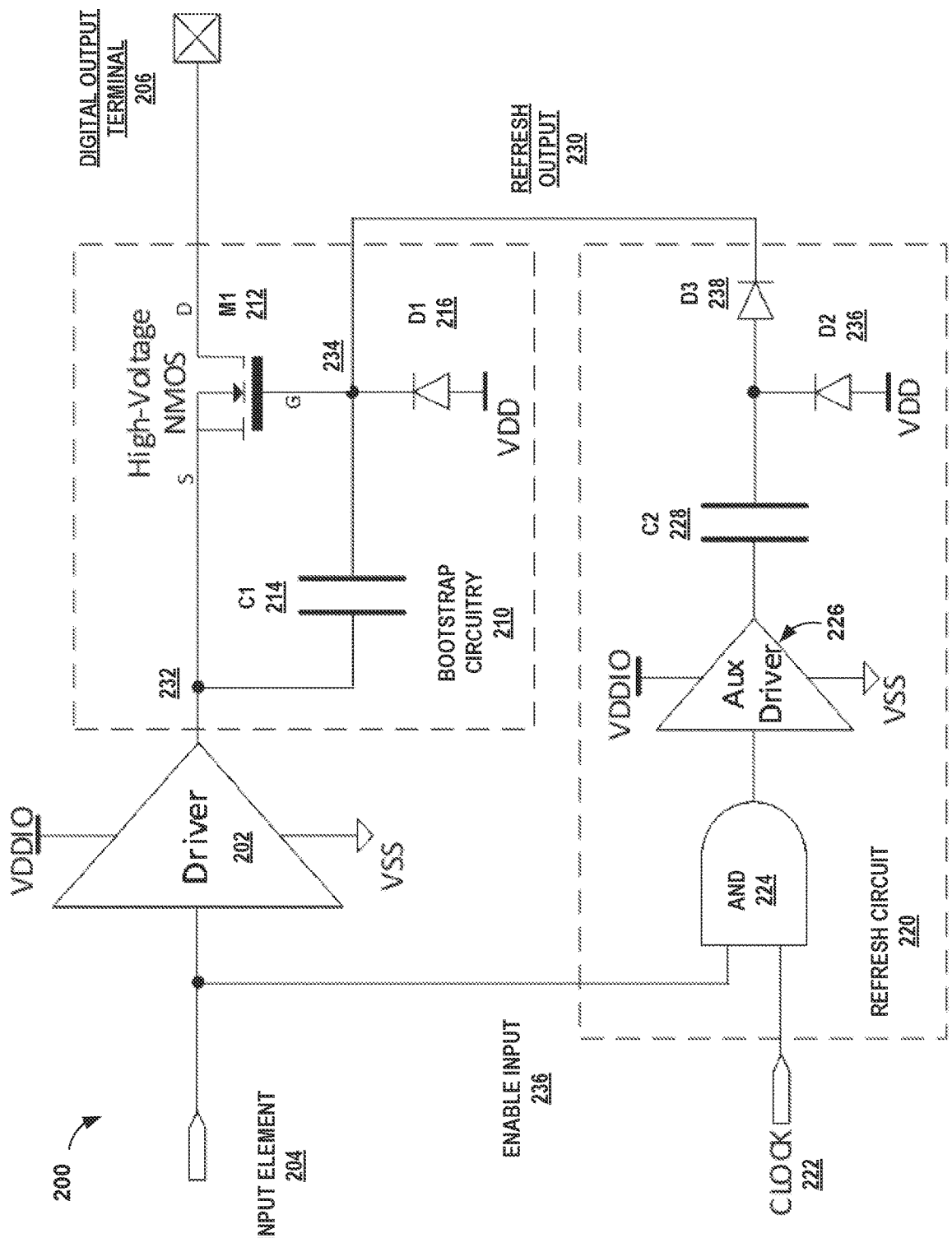
FIG. 2 is a schematic diagram illustrating a digital I/O terminal with an example implementation of a refresh circuit, according to one or more techniques of this disclosure.

FIG. 2 is a schematic diagram illustrating a digital I/O terminal with an example implementation of a refresh circuit, according to one or more techniques of this disclosure. Circuit 200 is an example of circuit 100 described above in relation to FIG. 1.

In the example of FIG. 2, circuit 200 includes driver circuit 202, which is electrically coupled to digital output terminal 206 through a pass-device, such as transistor M1 212. Bootstrap circuitry 210 also includes capacitor C1 214 and diode D1 216, which connects a gate 234 of transistor M1 212 to Vdd. Capacitor C1 214 connects output element 232 of driver circuit 202 to gate 234. In the example of FIG. 2, output element 232 of driver circuit 102 electrically connects to an input terminal, i.e. the source of transistor M1 212. Driver circuit 202, digital output terminal 206, transistor M1 212, bootstrap circuitry 210, C1 214, diode D1 216, gate 234, Vss, Vdd, $V_{DDIO}$ and refresh circuitry 220 are, respectively, examples of driver circuit 102, digital output terminal 106, pass-device 112, bootstrap circuitry 110, C1 114, diode D1 116, control terminal 134, Vdd, $V_{DDIO}$ and refresh circuitry 120 of FIG. 1. The characteristics and functions of driver circuit 202, digital output terminal 206, transistor M1 212, bootstrap circuitry 210, C1 214, diode D1 216, gate 234, Vss, Vdd, $V_{DDIO}$ and refresh circuitry 220 may be similar or the same as the characteristics and functions of, respectively, driver circuit 102, digital output terminal 106, pass-device 112, bootstrap circuitry 110, C1 114, diode D1 116, control terminal 134, Vss, Vdd, $V_{DDIO}$ and refresh circuitry 120 of FIG. 1.

The pass-device in the example of circuit 200 is high-voltage NMOS transistor M1 212 with the drain of transistor M1 212 connected to digital output terminal 206. NMOS transistor M1 212 may provide improved efficiency when compared to other types of pass-devices because of low on-resistance ($R_{DS-ON}$), for an N-channel MOSFET. Also, for the same on-resistance, an N-channel MOSFET may be lower cost compared with a P-channel MOSFET, e.g., an N-channel MOSFET may require a smaller die footprint on an IC compared to a P-channel MOSFET. However, turning an N-channel MOSFET completely ON requires a high enough $V_{GS}$ to minimize $R_{DS-ON}$, and avoid losses, such as heat loss, that may reduce efficiency.

As described above in relation to FIG. 1, bootstrap circuitry 210 may provide a gate-source voltage to ensure transistor M1 212 remains ON when driver circuit 202 outputs a digital one (with a magnitude of approximately $V_{DDIO}$) at output element 232.

Therefore, when driver circuit 202 outputs a digital zero, transistor M1 212 has a $V_{GS}$ equal to Vdd−Vdiode1, where Vdiode1 is the diode drop of D1 216. If input element 204 receives a logic '1,' then driver circuitry 202 outputs $V_{DDIO}$ (e.g. 5V) and the gate-source voltage $V_{GS}$ of transistor M1 212 will be:

$$V_{GS} = (V_{DD} - V_{diode1}) - \left(\frac{C_g}{(C1 + C_g)} \times V_{DDIO}\right)$$

where, Cg represents the total parasitic capacitance seen at the gate 234 of transistor M1 212. The capacitance value, i.e. size, of C1 214 should be selected such that the capacitance of C1 214 is high enough to limit the voltage drop caused by the parasitic capacitance of NMOS transistor M1 212, which may be affected by any parasitic gate current and non-ideal (i.e. finite) internal resistance at the gate of transistor M1 212.

Capacitor C1 214, and other components of bootstrap circuitry 220 may allow current leakage when circuit 200 holds a digital one for an extended period of time. Refresh circuitry 220 is one example implementation of a refresh circuit to configured to apply a predetermined voltage amplitude at the control terminal of the pass-device, transistor M1 212 to counter any leakage. The predetermined voltage amplitude may provide a sufficient gate-source voltage at gate 234 to ensure transistor M1 212 stays turned ON fully while driver circuit 202 outputs a digital one. Refresh circuit 220 includes AND gate 224, auxiliary driver circuit 226, capacitor C2 228, diodes D2 236 and D3 238. Enable input 236 connects to one input element of AND gate 224 and clock input element 222 connects to the second input element of AND gate 224. The output of AND gate 224 connects to the input of auxiliary driver circuit 226. Capacitor C2 228 connects the output of auxiliary driver 226 to the cathode of diode D2 236 and to the anode of diode D3 238. The cathode of diode D3 234 is refresh output 230, which connects to gate 234. Refresh output 230 is an example of refresh output 130 described above in relation to FIG. 1.

Similar to driver circuit 202 and driver circuit 102, described above in relation to FIG. 1, auxiliary circuit 226 is connected to power supply $V_{DDIO}$ and reference voltage Vss. Therefore, auxiliary circuit 226 will output a digital zero, i.e. approximately zero volts, when auxiliary circuit 226 receives a digital zero from AND gate 224. Similarly, auxiliary circuit 226 will output a digital one, i.e. approximately $V_{DDIO}$, when auxiliary circuit 226 receives a digital one from AND gate 224.

In operation, a digital one received by circuit 200 at input element 204 will enable a clock signal received at clock input element 222 to pass through AND gate 224 to auxiliary driver 226. When the clock signal is a logical low, i.e. a digital zero, capacitor C2 228 charges to approximately Vdd. Similar to the charging of capacitor C1 114 described above in relation to FIG. 1, auxiliary driver circuit 226 is configured to tie reference voltage Vss to a first plate of capacitor C2 228, which causes a second plate of the capacitor coupled to the cathode of D2 236 to charge to approximately a magnitude of the supply voltage, Vdd. The voltage across C2 228 will be Vdd, minus the voltage drop across D2 236 and minus any further voltage drop between auxiliary driver circuit 226 and reference voltage Vss.

When the clock signal is a logical one, refresh output 230 will couple a voltage to gate 234, via diode D3 238 with a magnitude of approximately Vdd+$V_{DDIO}$−Vdiode3. The magnitude of voltage applied to gate 234 may be an example of the predetermined magnitude of voltage applied to control terminal 134, described above in relation to FIG. 1.

Because auxiliary driver circuitry 226 in the arrangement of circuit 200 is not required to drive a high current, auxiliary driver circuitry 226 may be much smaller than the main driver, i.e. driver circuitry 202. Therefore, the example of circuit 200 may provide an advantage in lower cost, reduced IC footprint and reduced current consumption when compared to other techniques. Also, the frequency of the clock signal applied to clock input element 222 may be a fairly low frequency when compared to other techniques. A lower frequency clock signal may also reduce cost, cause less interference and reduce current consumption when compared to other techniques. The selected frequency for the clock input to clock input element 222 may depend on the arrangement and selection of components for circuit 200, the capacity, the size of the NMOS, or other switch used as the pass-device, as well as the type of technology used to implement circuit 200.

Figure 3:
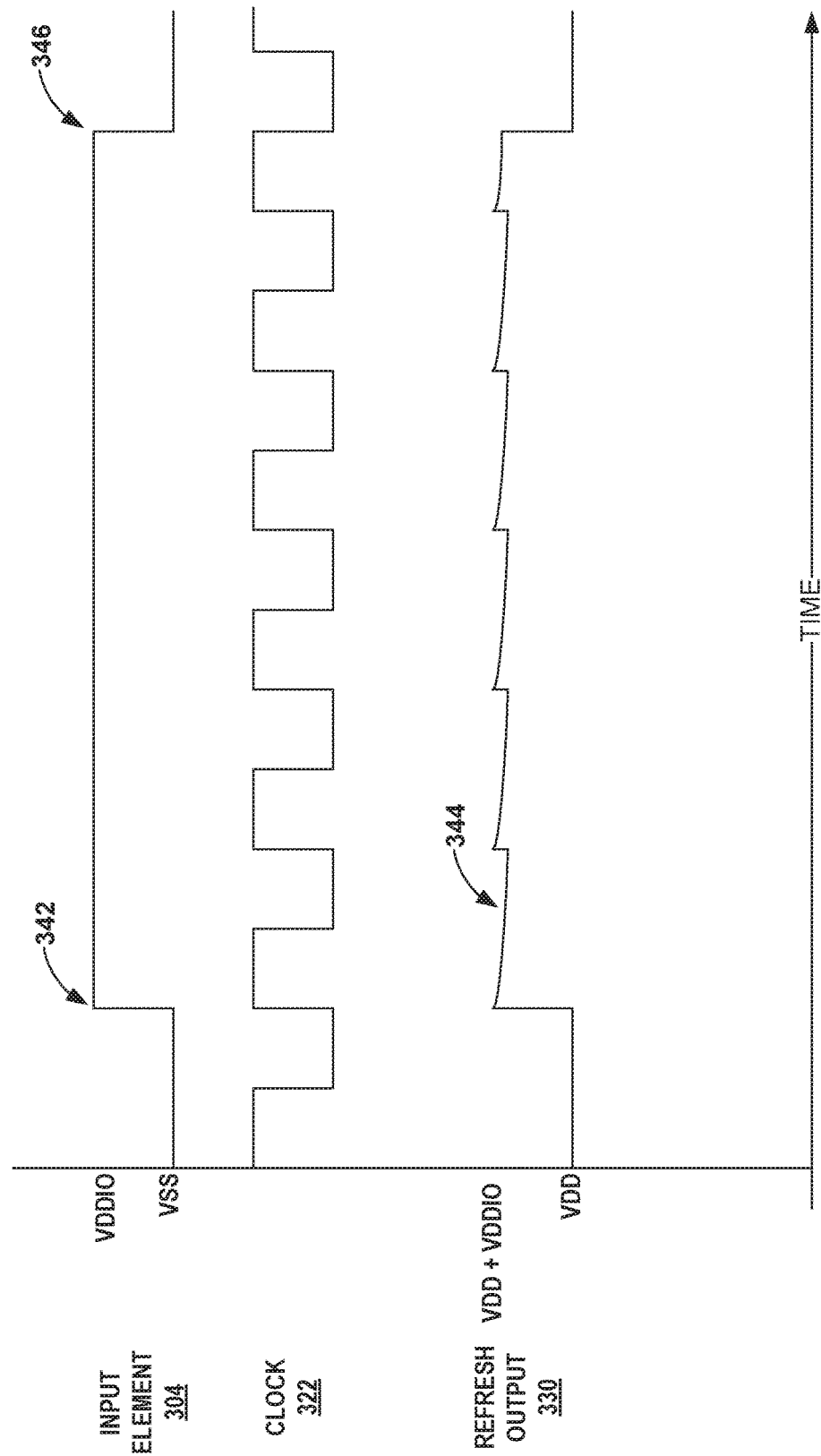
FIG. 3 is a timing diagram depicting an example operation of the refresh circuits described in relation to FIGS. 1 and 2.

FIG. 3 is a timing diagram depicting an example operation of refresh circuit 120 and refresh circuit 220 described above in relation to FIGS. 1 and 2. In FIG. 3, before the signal received at input element 304 is a digital one (342) the clock signal 322 is disabled, as indicated by refresh output 330 with a magnitude of Vdd. When the signal at input element 304 transitions to a digital 1 (342), clock signal 322 may be applied to auxiliary driver circuitry 226 through AND gate 224, as described above in relation to FIG. 2. Refresh output 330 applies a voltage with magnitude of approximately Vdd+$V_{DDIO}$ to the control terminal of the pass-device, e.g. gate 234 of transistor M1 212 depicted in FIG. 2. As described above in relation to FIG. 2, the voltage applied to the control terminal may be reduced by a voltage drop, such as the voltage drop, Vdiode3, across diode D3 238.

The voltage at the control terminal may decay somewhat (344) based on the amount of leakage which may be present at the control terminal. Refresh output 330 periodically apply the predetermined magnitude of voltage of approximately Vdd+$V_{DDIO}$ to the control terminal of the pass-device when clock signal 322 is a digital one. Applying the predetermined magnitude of voltage may maintains the gate source voltage across the capacitor to ensure the pass-device remains ON while the circuit is outputting a digital one at a digital output terminal, such as digital output terminal 106 described above in relation to FIG. 1. When the signal received at the input element 304 is a digital zero (346), the refresh circuit is disabled and refresh output 330 returns to a magnitude of Vdd.

Figure 4A:
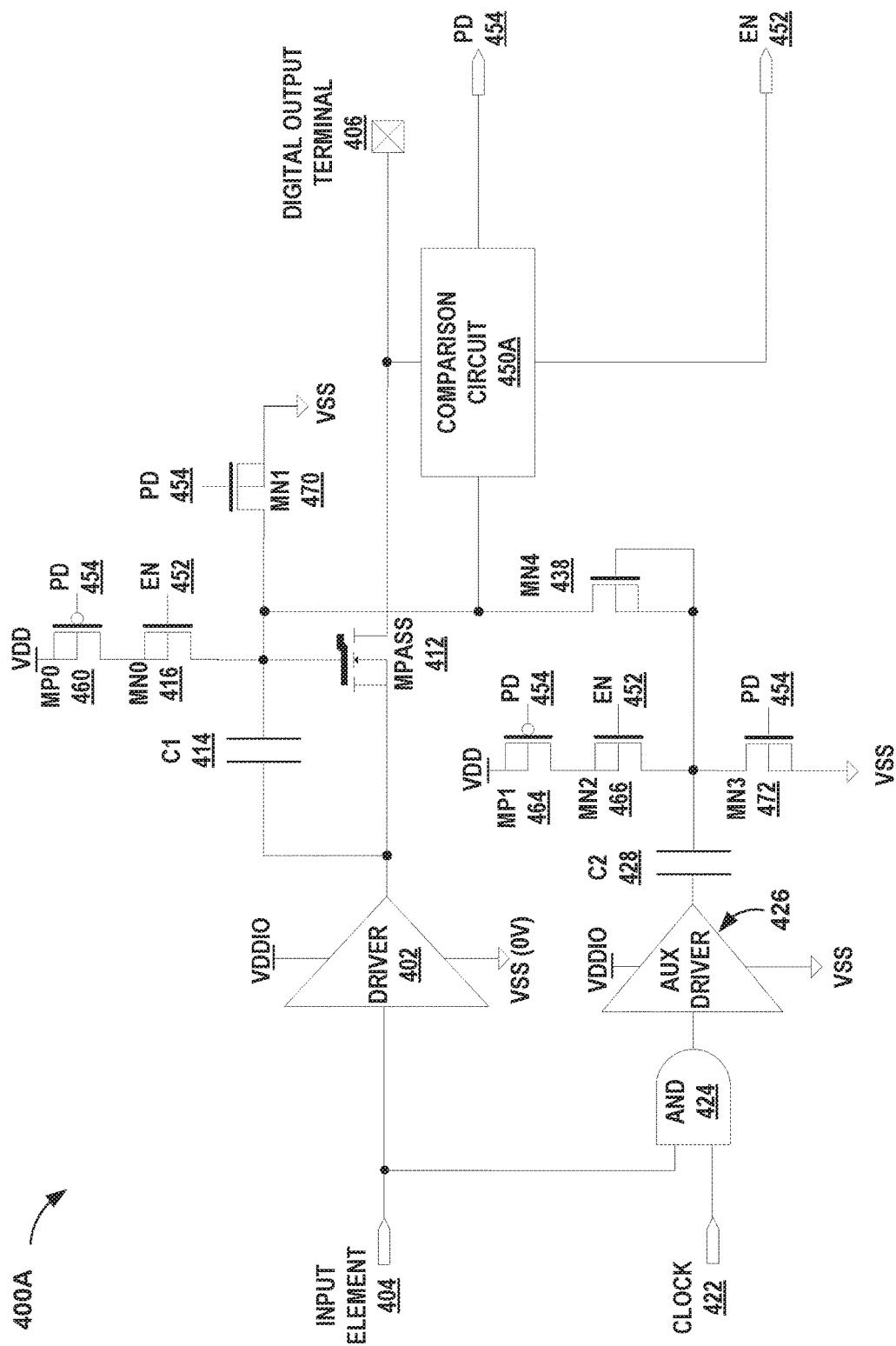
FIG. 4A is a schematic diagram illustrating an example digital I/O protection circuit with overvoltage monitoring according to one or more techniques of this disclosure.

FIG. 4A is a schematic diagram illustrating an example digital I/O protection circuit with overvoltage monitoring according to one or more techniques of this disclosure. Circuit 400A is another example of circuit 100 and circuit 200 described above in relation to FIGS. 1 and 2. Items depicted in FIG. 4A, such as driver circuitry 402, auxiliary driver circuitry 426, AND gate 424, input element 404, clock input terminal 422, Vdd, VDDIO 446, reference voltage Vss, and digital output terminal 406 may have the same or similar characteristics as, respectively, driver circuitry 102, auxiliary driver circuitry 226, AND gate 224, input element 104, clock input terminal 122, Vdd, VDDIO, reference voltage Vss, and digital output terminal 106 described above in relation to FIGS. 1 and 2.

Similar to circuit 100, circuit 400A includes a pass-device, transistor Mpass 412, to protect driver circuitry 402 from an overvoltage event at digital output terminal 406 as well as bootstrap circuitry to ensure that Mpass 412 stays ON when circuit 400A receives a digital one at input element 404. In the example of circuit 400A, pass-device Mpass 412 is an NMOS transistor with the source connected to the output of driver circuitry 402 and the drain connected to digital output terminal 406.

The bootstrap circuitry of circuit 400A includes capacitor C1 414 connected between the source and gate of Mpass 412 and NMOS transistor MN0 416, which is a switch that connects the control terminal of pass-device Mpass 412 to supply voltage Vdd. Transistor MN0 416 performs a function similar to diode D1 116 described above in relation to FIG. 1. The drain of MN0 416 connects to the gate of Mpass 412 and the gate of MN0 416 is controlled by the enable signal EN 452 from comparison circuitry 450A.

The bootstrap circuitry also includes pull-down transistors MP0 460 and MN1 470, which are controlled by the pull-down signal PD 454 from comparison circuitry 450A. Transistor MP0 460 may comprise a PMOS transistor with the source connected to supply voltage Vdd and the drain connected to the source of MN0 416. MN1 470 is an NMOS transistor with the drain connected to the gate of Mpass 412 and the source connected to reference voltage Vss. In operation, when MP0 460 receives a pull-down signal from comparison circuitry 450A via PD 454, i.e. a logical HIGH, MP0 460 may turn OFF and isolate Vdd from MN0 416 and the gate of Mpass 412. When MN1 470 receives the pull-down signal via PD 454, MN1 470 may turn ON, which connects the gate of Mpass 412 to Vss and ensures Mpass 12 turns OFF to isolate driver circuitry 402 from digital output terminal 406.

The refresh circuitry of circuit 400A may be similar to refresh circuit 220 described above in relation to FIG. 2. The refresh circuitry of circuit 400A includes clock input element 422, connected to one of the two input terminals of AND gate 424. Input element 404 connects to the second input terminal of AND gate 424. The output of AND gate 424 connects to the input of auxiliary driver circuit 426. A first terminal of capacitor C2 428 connects the output of auxiliary driver circuit 426. A second terminal of capacitor C2 428 connects to the drain of transistor MN2 436 and to the source and gate of transistor MN4 438. Transistor MN2 436 is controlled by the enable signal EN 452 from comparison circuitry 450A and performs a function similar to that of diode D2 236 described above in relation to FIG. 2. Transistor MN4 438 is a diode connected transistor and performs a function similar to the function of diode D3 238 described above in relation to FIG. 2. The drain of transistor MN4 238 connects to the gate of Mpass 412, as well as to comparison circuitry 450A.

The refresh circuitry also includes pull-down transistors MP1 464 and MN3 472, which are controlled by the pull-down signal PD 454 from comparison circuitry 450A, which function similar to pull-down transistors MP0 460 and MN1 470 described above. Transistor MP1 464 is a PMOS transistor with the source connected to supply voltage Vdd and the drain connected to the source of MN2 466. MN3 472 is an NMOS transistor with the drain connected to the drain of MN2 466 and the source connected to reference voltage Vss. In operation, when MP1 464 receives a pull-down signal from comparison circuitry 450A via PD 454, MP1 464 may turn OFF and isolate Vdd from MN2 466.

When MN3 472 receives the pull-down signal via PD 454, MN3 472 may turn ON, which connects the second terminal of capacitor C2 428 to Vss, which prevents the refresh output signal from turning on Mpass 412 via diode connected transistor MN4 438.

Similar to circuits 100 and 200 described above in relation to FIGS. 1 and 2, in operation, when circuit 400A receives a digital zero at input element 404, driver circuit 402 outputs a digital zero causing capacitor C1 414 to charge to approximately Vdd. In other words, driver circuit 402 is configured to output reference voltage Vss to a first terminal of capacitor C1 414, which causes a second plate of the capacitor coupled to the supply voltage Vdd via MN0 416 and MP0 460, to charge to approximately a magnitude of the supply voltage, Vdd.

In the example of circuit 400A, comparison circuitry 450A is configured to output the enable signal, i.e. a logical HIGH, via EN 452 to turn ON transistor MN0 416 when magnitude of voltage at digital output terminal 406 is less than the magnitude of voltage at the gate of Mpass 412. Comparison circuit 450A is configured to output a logical LOW via pull-down PD 454 when comparison circuit 450A determines that there is no overvoltage at digital output terminal 406. The enable signal EN 452 and pull-down signal PD 454 may be configured to be complementary to each other. That is, when EN 452 is high, PD 454 is low and vice versa.

Comparison circuit 450A may be implemented by any combination of hardware, firmware or software, such as an application specific integrated circuit (ASIC), a microcontroller, or any other type of processing circuitry. In some examples, comparison circuit 450A may include one or more processors, one or more analog-to-digital converters (ADC) and similar circuitry. If implemented in software, the functions may be stored on a tangible computer-readable storage medium and executed by a processor or hardware-based processing unit. Instructions may be executed by the one or more processors, such as one or more DSPs, general purpose microprocessors, ASICs, FPGAs, or other equivalent integrated or discrete logic circuitry. Accordingly, the term "processor," as used herein, such as may refer to any of the foregoing structure or any other structure suitable for implementation of the techniques described herein. Also, the techniques could be fully implemented in one or more circuits or logic elements.

When circuit 400A receives a digital one at input element 404, driver circuit 402 outputs a digital one which in the example of FIG. 4A is approximately $V_{DDIO}$. Capacitor C1 414 may retain the voltage between the first plate and the second plate of capacitor C1 414, and therefore the magnitude of voltage between the source and the gate $V_{GS}$ of pass-device Mpass 412 remains approximately Vdd. The $V_{GS}$ with a magnitude of Vdd may ensure that Mpass 412 remains ON and allows the digital one from driver circuit 402 to be output from digital output terminal 406.

As described above in relation to FIGS. 1 and 2, the refresh circuitry of circuit 400A is configured to periodically apply a predetermined voltage to the control terminal, i.e. the gate of Mpass 412 to counter any leakage in the bootstrap circuitry, such as at capacitor C1 414. The a digital one at input element 404, enables a clock signal received at clock input element 422 to pass through AND gate 424 to auxiliary driver circuit 426. When the clock signal is a logical low, i.e. a digital zero, capacitor C2 428 charges to approximately Vdd via transistors MP1 464 and MN2 466. Similar to capacitor C1 114 described above in relation to FIG. 1, auxiliary driver circuit 426 is configured to tie reference voltage Vss to a first plate of capacitor C2 428, which causes a second plate of the capacitor coupled to the MN2 466 to charge to approximately a magnitude of the supply voltage, Vdd. The voltage across C2 228 will be Vdd, minus any voltage drops across transistors MP1 464 and MN2 466.

When the clock signal is a logical one, refresh output 230 will couple a voltage to the gate of Mpass 412, via transistor MN4 438 with a magnitude of approximately Vdd+$V_{DDIO}$. The magnitude of voltage applied to gate 434 may be an example of the predetermined magnitude of voltage applied to control terminal 134, described above in relation to FIG. 1. Transistors MN0 416 and MN2 466 perform a similar switching function as diodes D1 116 and D2 236, described above in relation to FIGS. 1 and 2.

Figure 4B:
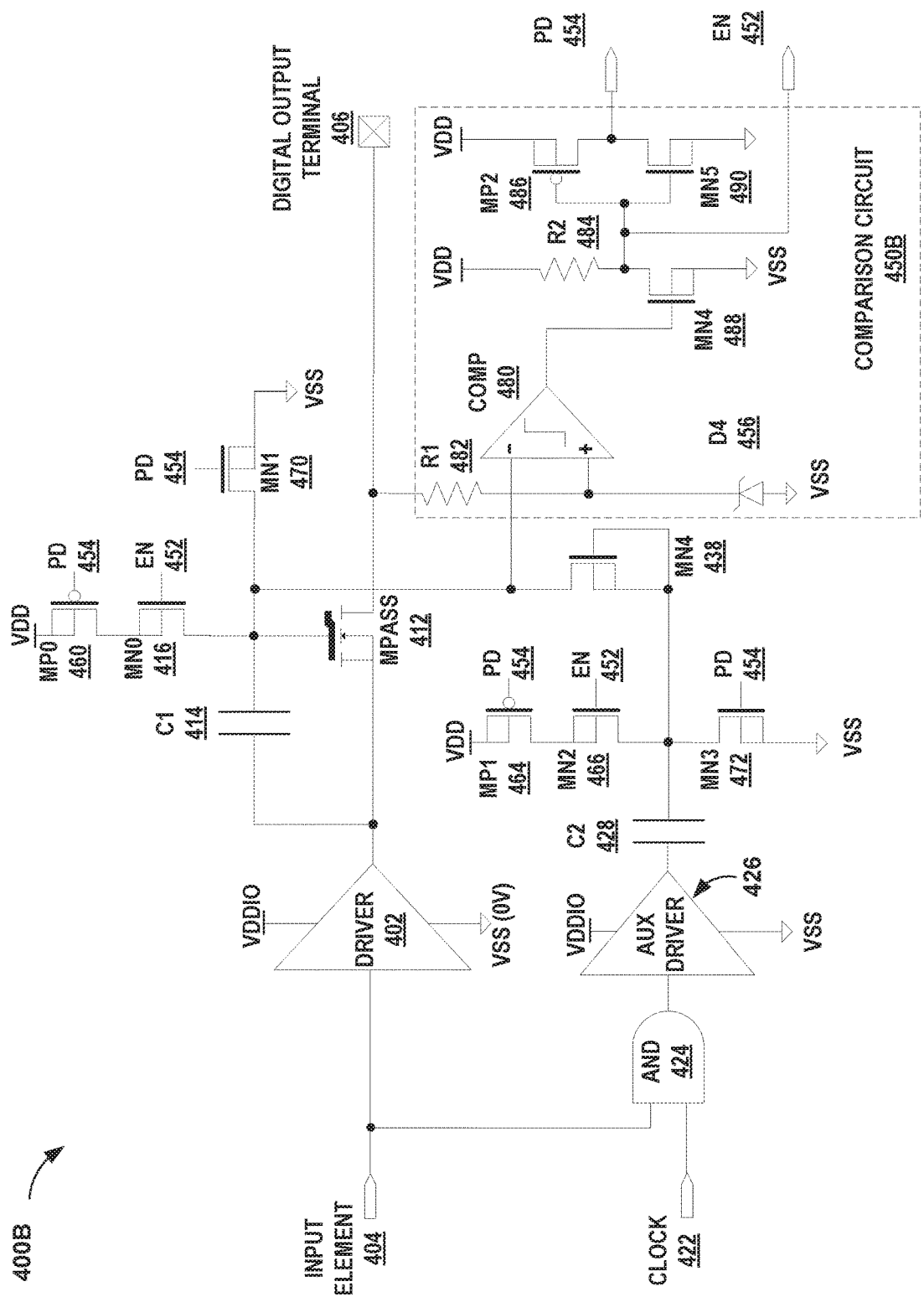
FIG. 4B is a schematic diagram illustrating an example digital I/O protection circuit with details of an example implementation of overvoltage monitoring according to one or more techniques of this disclosure.

FIG. 4B is a schematic diagram illustrating an example digital I/O protection circuit with details of an example implementation of overvoltage monitoring according to one or more techniques of this disclosure. Circuit 400B is an example of circuit 400A, and the functions and characteristics of components of circuit 400B are the same as the functions and characteristics of components of circuit 400A described above in relation to FIG. 4A, unless otherwise noted. Circuit 400B includes one example implementation of a comparison circuit, similar to comparison circuit 450A described above in relation to FIG. 4A. In other examples, the arrangement and selection of components in circuits 400A and 400B may be different than that shown in FIGS. 4A and 4B. As one example, MN0 416 and MN3 472 may be implemented with diodes, while leaving the remaining arrangement as shown in FIGS. 4A and 4B.

Comparison circuit 450B includes comparator 480 with the non-inverting input connected to digital output terminal 406 via resistor R1 482 and to reference voltage Vss via Zener diode D4 456. The inverting input of comparator 480 connects to the gate of Mpass 412. Thus, if an overvoltage at digital output terminal 406 exceeds a threshold magnitude of voltage compared to a magnitude of voltage at the control terminal of the pass-device, Mpass 412, comparator 480 may output a logical HIGH. In the example of comparison circuit 450B, the threshold is set by selecting the characteristics of Zener diode D4 456 and the value of resistor R1 482.

The output of comparator 480 connects to the gate of transistor MN4 488. The source of transistor MN4 488 connects to the reference voltage Vss and the drain of MN4 488 connects to Vdd via resistor R2 484. The drain of MN4 488 also connects to the gates of transistors MP2 486 and MN5 490. The source of MN5 490 connects to Vss and the drain of MN5 490 connects to the drain of MP2 486. The source of MP2 connects to Vdd.

Figure 5:
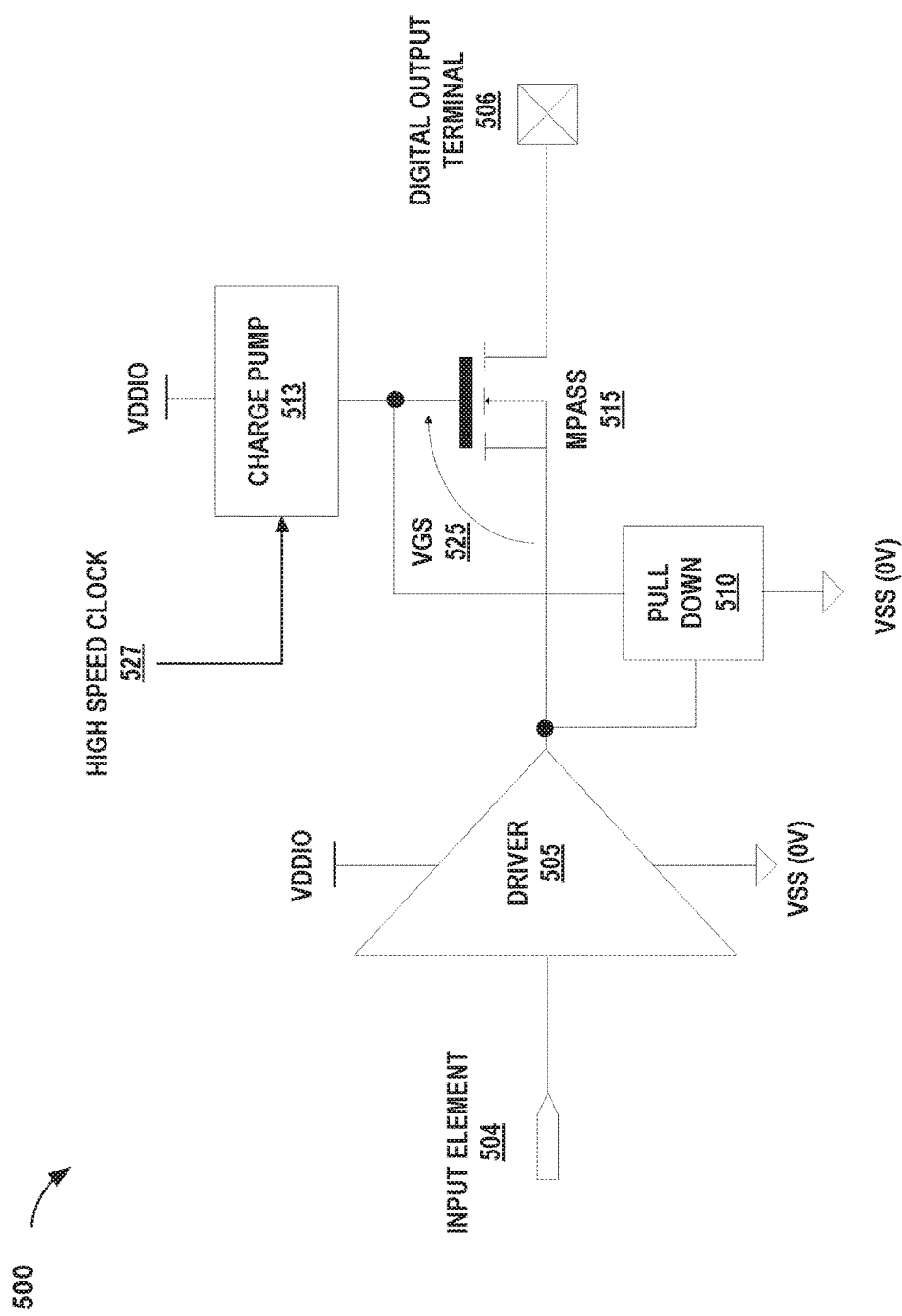
FIG. 5 is an example digital output protection circuit that uses a charge pump and pull-down circuit to operate a pass-device.

FIG. 5 is an example digital output protection circuit that uses a charge pump and pull-down circuit to operate a pass-device. The example of circuit 500 uses additional circuitry, including a charge pump to control the operation of the pass-device rather than controlling the pass-device using the output driver as described above in relation to FIGS. 1-4B.

In the example of circuit 500, driver 505 receives a digital input at input element 504 and outputs a buffered digital output to digital output terminal 506 via pass-device, Mpass 515. Circuit 500 includes low-voltage driver 505 with a high-voltage NMOS pass-device Mpass 515 in series. Mpass 515 prevents propagation of high-voltages that might be applied at the digital output terminal 506 to the LV driver, such as from a short to battery. The high-voltage NMOS pass-device, Mpass 515 is driven by charge-pump 513, to provide a high enough $V_{GS}$ 525 so Mpass 515 turns ON with a low enough drain-source resistance $R_{DS\text{-}ON}$. In some examples, depending on the technology used, a circuit such as circuit 500 may also include pull-down circuit 510 to dynamically lower the gate voltage of the pass-device when driver 505 propagates a logic '0.' As one example, for an SPT9U MOSFET, to fulfill the required gate-source voltage (e.g. for an output 'high' level of 5V) the maximum $V_{GS}$ may be 2.65V. Pull-down circuit 510 is coupled to the gate of Mpass 515 and controlled by driver 505. In the example of circuit 500, charge-pump 513 therefore needs to drive sufficient current to operate pull down circuit 510. Therefore, to recharge the capacitors of charge pump 513 requires a sufficiently high speed clock 527, which may increase cost and has an increased risk of interference with other areas of circuit (not shown in FIG. 500). Circuit 500 may have disadvantages because circuit 500 may also require a relatively large area on an IC.

One advantage of the techniques of this disclosure described above in relation to FIGS. 1-4B is that the techniques may achieve an improved power efficiency in terms of current consumption. In the example of circuits 100-400B, a charge pump running at high speed is not required to drive the gate of the pass-device, and there is no static current consumption caused by pull-down circuitry, which would be needed by circuit 500 to limit the $V_{GS}$ of the NMOS when the signal received by input element 504 goes 'Low'.

Figure 6:
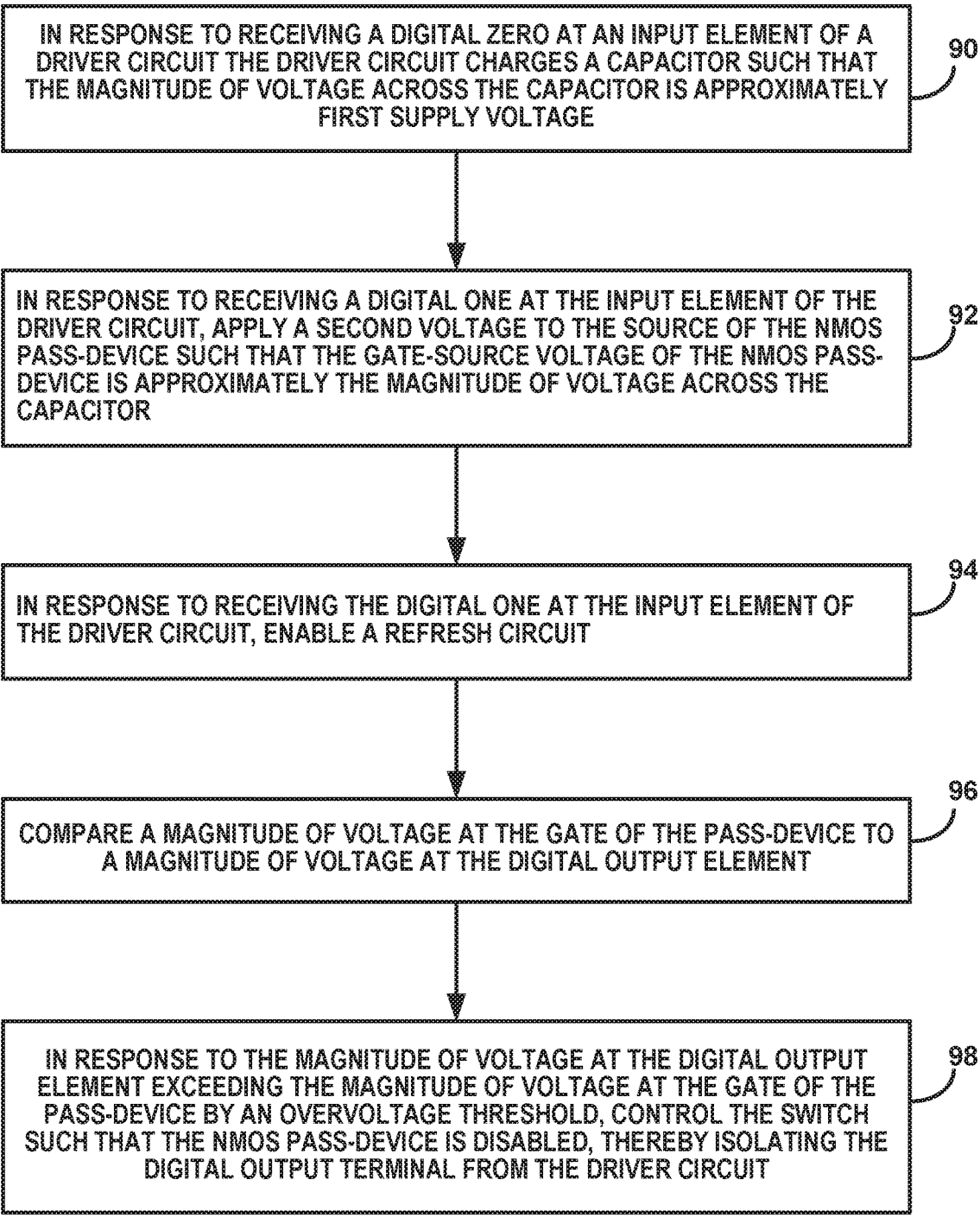
FIG. 6 is a flowchart illustrating an example operation of the circuit of this disclosure.

FIG. 6 is a flowchart illustrating an example operation of the circuit of this disclosure. The blocks of FIG. 6 will be described in terms of FIG. 4B, unless otherwise noted.

In response to receiving a digital zero at input element 404 connected to the input of driver circuit 402, capacitor C1 414 charges via transistor MN0 416 such that the magnitude of voltage across C1 414 is approximately equal to supply voltage Vdd, less any voltage drop across MP0 460 and MN0 416 (90). C1 414 is also connected between a gate and a source of NMOS pass-device Mpass 412.

In response to receiving a digital one at input element 404, driver circuit 402 may apply digital supply voltage $V_{DDIO}$ to the source of the Mpass 412. Because C1 414 retains Vdd across the two terminals of C1 414, the gate-source voltage of Mpass 412 is approximately the magnitude of voltage across the capacitor (92). As described above in relation to FIG. 4B, the voltage Vdd across C1 414 is configured to make sure that transistor Mpass 412 stays ON to send the digital one to digital output terminal 406.

Also, receiving a digital one at input element 404, enables a clock signal received at clock input element 422 to pass through AND gate 424. The clock signal enables the refresh circuit, e.g. refresh circuit 220 described above in relation to FIG. 2, to periodically apply a voltage to the control terminal of the pass-device, Mpass 412 (94).

Comparison circuit 450B is configured to compare a of voltage at the gate of pass-device Mpass 412 to a of voltage at digital output terminal 406 (96). Based on the comparison, comparator 180 controls the operation of pull-down transistors, e.g. MP0 460 and MN1 470, as well as switches MN0 416 and MN3 472.

To protect driver 402 from damage caused by an overvoltage, in response to the voltage at digital output terminal 406 exceeding the voltage at the gate of the Mpass 412 by an overvoltage threshold, comparison circuit 450B is configured to control switch MN0 416 to turn OFF, i.e. disable, Mpass 412, thereby isolating the digital output terminal from the driver circuit (98).

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described The techniques of this disclosure may also be described in the following examples.

Example 1

A circuit comprising: a driver circuit comprising an input element and an output element, wherein the output element is electrically coupled to a digital output terminal via a pass-device. The pass-device comprises a first terminal, a second terminal and a control terminal, the pass-device is configured to protect the driver circuit from an overvoltage applied to the digital output terminal, the output element of the driver circuit is electrically connected both to the first terminal of the pass-device and via a capacitor to the control terminal of the pass-device, the control terminal of the pass-device is coupled to a supply voltage through a switch, and the second terminal of the pass-device is coupled to the digital output terminal.

Example 2

The circuit of example 1, wherein the pass-device comprises an N-channel metal-oxide semiconductor (NMOS) transistor and wherein the first terminal is a source of the NMOS transistor, the second terminal is a drain and the control terminal is a gate.

Example 3

The circuit of any combination of examples 1-2, further comprising a refresh circuit configured to apply a predetermined voltage amplitude at the control terminal of the pass-device, the refresh circuit comprising: an enable input element electrically coupled to the input element of the driver circuit, a refresh output element coupled to the control terminal of the pass-device, and a clock input element.

Example 4

The circuit of any combination of examples 1-3, wherein the capacitor is a first capacitor, the refresh circuit further comprising: a second capacitor; and an auxiliary driver circuit configured to charge the second capacitor in response to receiving a digital one at the enable input element.

Example 5

The circuit of any combination of examples 1-4, wherein the switch is a first switch, the refresh circuit further comprising a second switch arranged such that the second switch controls the refresh output element.

Example 6

The circuit of any combination of examples 1-5, wherein in response to receiving a digital zero at the input element: the driver circuit is configured to output a reference voltage to a first plate of the capacitor and a second plate of the capacitor is configured to charge to approximately a magnitude of the supply voltage.

Example 7

The circuit of any combination of examples 1-6, wherein the pass-device is configured to protect the driver circuit from an overvoltage applied to the digital output terminal of at least forty volts greater than the reference voltage.

Example 8

The circuit of any combination of examples 1-7, wherein in response to receiving a digital one at the input element: the driver circuit is configured to output a first voltage, wherein: a magnitude of the first voltage is approximately equal to a digital supply voltage, and a magnitude of voltage between the first terminal of the pass-device and the control terminal is approximately equal to the supply voltage.

Example 9

The circuit of any combination of examples 1-8, wherein an overvoltage is a magnitude of voltage at the digital output terminal that exceeds a threshold magnitude of voltage compared to a magnitude of voltage at the control terminal of the pass-device.

Example 10

The circuit of any combination of examples 1-9, further comprising comparison circuitry, wherein the comparison circuitry is configured to: determine whether the magnitude of voltage at the digital output terminal is an overvoltage. In response to determining that the magnitude of voltage at the digital output terminal is an overvoltage, control the switch to disable the pass-device, and thereby prevent the overvoltage from reaching the output element of the driver circuit.

Example 11

The circuit of any combination of examples 1-10, wherein further comprising a refresh circuit, wherein in response to determining that the magnitude of voltage at the digital output terminal is an overvoltage, the comparison circuitry is further configured to disable the refresh circuitry.

Example 12

The circuit of any combination of examples 1-11, wherein the comparison circuitry comprises one or more processors.

Example 13

The circuit of any combination of examples 1-12, wherein the comparison circuitry comprises a comparator with a first input element and a second input element and an output element, wherein: the first input element of the comparator is electrically coupled to the digital output terminal, the second input element of the comparator is electrically coupled to the control terminal of the pass-device, and the output element of the comparator causes the switch to pull down the control terminal to isolate the digital output terminal from the output element of the driver circuit.

Example 14

A method comprising: in response to receiving a digital zero at an input element of a driver circuit, charging a capacitor such that the magnitude of voltage across the capacitor is approximately first supply voltage, wherein the capacitor is coupled to the first supply voltage through a switch, and wherein the capacitor is connected between a gate and a source of an N-channel metal-oxide semiconductor (NMOS) pass-device. In response to receiving a digital one at the input element of the driver circuit, applying, by the driver circuit, a second voltage to the source of the NMOS pass-device such that the gate-source voltage of the NMOS pass-device is approximately the magnitude of voltage across the capacitor.

Example 15

The method of example 14, further comprising, in response to receiving the digital one at the input element of the driver circuit, enabling a refresh circuit.

Example 16

The method of any combination of examples 14-15, wherein the refresh circuit is configured to maintain a predetermined magnitude of voltage at the gate of the pass-device and wherein the refresh circuit comprises: an enable input electrically coupled to the input element of the driver circuit, and a refresh output element coupled to the gate of the pass-device.

Example 17

The method of any combination of examples 14-16, wherein the refresh circuit is configured to periodically maintain the predetermined magnitude of voltage at the gate of the pass-device based on a clock signal input to the refresh circuit.

Example 18

The method of any combination of examples 14-17, wherein the pass-device is configured to isolate the driver circuit from a digital output element, the method further comprising: comparing a voltage at the gate of the pass-device to a voltage at the digital output element. In response to the voltage at the digital output element exceeding the voltage at the gate of the pass-device by an overvoltage threshold, controlling the switch such that the NMOS pass-device is disabled, thereby isolating the digital output terminal from the driver circuit.

Example 19

The method of any combination of examples 14-18, further comprising, in response to the voltage at the digital output element exceeding the voltage at the gate of the pass-device by an overvoltage threshold, controlling a second switch to disable a refresh circuit, wherein the refresh circuit is configured to maintain a predetermined magnitude of voltage at the gate of the pass-device.

Various examples of the disclosure have been described. These and other examples are within the scope of the following claims.

What is claimed is:

1. A circuit comprising:
   a driver circuit comprising an input element and an output element, wherein the output element is electrically coupled to a digital output terminal via a pass-device, wherein:
   the pass-device comprises a first terminal, a second terminal and a control terminal,
   the pass-device is configured to protect the driver circuit from an overvoltage applied to the digital output terminal,
   the output element of the driver circuit is electrically connected both to the first terminal of the pass-device and a first terminal of a capacitor,
   a second terminal of the capacitor different from the first terminal connects to the control terminal of the pass-device,
   the control terminal of the pass-device and the second terminal of the capacitor are coupled to a supply voltage through a switch, and
   the second terminal of the pass-device is coupled to the digital output terminal.

2. The circuit of claim 1, wherein the pass-device comprises an N-channel metal-oxide semiconductor (NMOS) transistor and wherein the first terminal is a source of the NMOS transistor, the second terminal is a drain and the control terminal is a gate.

3. The circuit of claim 1, further comprising a refresh circuit configured to apply a predetermined voltage amplitude at the control terminal of the pass-device, the refresh circuit comprising:
   an enable input element electrically coupled to the input element of the driver circuit;
   a refresh output element coupled to the control terminal of the pass-device; and
   a clock input element.

4. The circuit of claim 3, wherein the capacitor is a first capacitor, the refresh circuit further comprising:
   a second capacitor; and
   an auxiliary driver circuit configured to charge the second capacitor in response to receiving a digital one at the enable input element.

5. The circuit of claim 4, wherein the switch is a first switch, the refresh circuit further comprising a second switch arranged such that the second switch controls the refresh output element.

6. The circuit of claim 1, wherein, in response to receiving a digital zero at the input element:
   the driver circuit is configured to output a reference voltage to a first plate of the capacitor; and a second plate of the capacitor is configured to charge to approximately a magnitude of the supply voltage.

7. The circuit of claim 6, wherein the pass-device is configured to protect the driver circuit from the overvoltage applied to the digital output terminal of at least forty volts greater than the reference voltage.

8. The circuit of claim 1, wherein, in response to receiving a digital one at the input element:
the driver circuit is configured to output a first voltage, wherein:
a magnitude of the first voltage is approximately equal to a digital supply voltage, and
a magnitude of voltage between the first terminal of the pass-device and the control terminal is approximately equal to the supply voltage.

9. The circuit of claim 1, wherein the overvoltage is a magnitude of voltage at the digital output terminal that exceeds a threshold magnitude of voltage compared to a magnitude of voltage at the control terminal of the pass-device.

10. The circuit of claim 9, further comprising comparison circuitry, wherein the comparison circuitry is configured to:
determine whether the magnitude of voltage at the digital output terminal is the overvoltage;
in response to determining that the magnitude of voltage at the digital output terminal is the overvoltage, control the switch to disable the pass-device, and thereby prevent the overvoltage from reaching the output element of the driver circuit.

11. The circuit of claim 10, further comprising a refresh circuit, wherein in response to determining that the magnitude of voltage at the digital output terminal is the overvoltage, the comparison circuitry is further configured to disable the refresh circuitry.

12. The circuit of claim 10, wherein the comparison circuitry comprises one or more processors.

13. The circuit of claim 10, wherein the comparison circuitry comprises a comparator with a first input element and a second input element and an output element, wherein:
the first input element of the comparator is electrically coupled to the digital output terminal,
the second input element of the comparator is electrically coupled to the control terminal of the pass-device, and
the output element of the comparator causes the switch to pull down the control terminal to isolate the digital output terminal from the output element of the driver circuit.

14. The circuit of claim 1,
wherein the switch is a first switch, and
wherein the control terminal of the pass-device and the second terminal of the capacitor are coupled to the supply voltage through a second switch in series with the first switch.

15. A method comprising:
in response to receiving a digital zero at an input element of a driver circuit, charging a capacitor such that a magnitude of voltage across the capacitor is approximately first supply voltage,
wherein the capacitor is coupled to the first supply voltage through a switch, and
wherein the capacitor is connected between a gate and a source of an N-channel metal-oxide semiconductor (NMOS) pass-device, and
wherein an output element of the driver circuit is electrically connected directly through the capacitor to a control terminal of the pass-device;
in response to receiving a digital one at the input element of the driver circuit, applying, by the driver circuit, a second voltage to the source of the NMOS pass-device such that a gate-source voltage of the NMOS pass-device is approximately the magnitude of voltage across the capacitor.

16. The method of claim 15, further comprising, in response to receiving the digital one at the input element of the driver circuit, enabling a refresh circuit.

17. The method of claim 16, wherein the refresh circuit is configured to maintain a predetermined magnitude of voltage at the gate of the pass-device and wherein the refresh circuit comprises:
an enable input electrically coupled to the input element of the driver circuit, and
a refresh output element coupled to the gate of the pass-device.

18. The method of claim 17, wherein the refresh circuit is configured to periodically maintain the predetermined magnitude of voltage at the gate of the pass-device based on a clock signal input to the refresh circuit.

19. The method of claim 15, wherein the pass-device is configured to isolate the driver circuit from a digital output element, the method further comprising:
comparing a voltage at the gate of the pass-device to a voltage at the digital output element;
in response to the voltage at the digital output element exceeding the voltage at the gate of the pass-device by an overvoltage threshold, controlling the switch such that the NMOS pass-device is disabled, thereby isolating the digital output terminal from the driver circuit.

20. The method of claim 19, further comprising, in response to the voltage at the digital output element exceeding the voltage at the gate of the pass-device by the overvoltage threshold, controlling a second switch to disable a refresh circuit, wherein the refresh circuit is configured to maintain a predetermined magnitude of voltage at the gate of the pass-device.

* * * * *